(12) United States Patent
Cheek et al.

(10) Patent No.: US 6,420,263 B1
(45) Date of Patent: Jul. 16, 2002

(54) METHOD FOR CONTROLLING EXTRUSIONS IN ALUMINUM METAL LINES AND THE DEVICE FORMED THEREFROM

(75) Inventors: Roger W. Cheek; George A. Dunbar, III, both of Essex Junction; Robert M. Geffken, Burlington; William J. Murphy, Essex Junction; Prabhat Tiwari, South Burlington; David H. Yao, Essex, all of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/514,511

(22) Filed: Feb. 28, 2000

(51) Int. Cl.⁷ .......................... H01L 21/44; C23C 14/32
(52) U.S. Cl. .................. 438/679; 438/685; 438/688; 204/192.15; 204/192.17; 204/298.12
(58) Field of Search .................. 438/679, 685, 438/688; 257/675; 204/192.15, 192.17, 298.12

(56) References Cited

U.S. PATENT DOCUMENTS

| 4,891,112 A | | 1/1990 | Wong ....................... 204/192.3 |
| 5,108,570 A | * | 4/1992 | Wang et al. .............. 204/192.3 |
| 5,108,951 A | | 4/1992 | Chen et al. .................. 437/187 |
| 5,358,615 A | | 10/1994 | Grant et al. ........... 204/192.15 |
| 5,374,592 A | | 12/1994 | MacNaughton et al. .... 437/194 |
| 5,597,745 A | | 1/1997 | Byun et al. .................... 437/41 |
| 5,700,718 A | | 12/1997 | McTeer ....................... 437/192 |
| 5,705,429 A | * | 1/1998 | Yamaha et al. ............. 437/194 |

* cited by examiner

Primary Examiner—Alexander G. Ghyka
(74) Attorney, Agent, or Firm—Schmeiser, Olsen & Watts; Robert A. Walsh

(57) ABSTRACT

A method of forming a semiconductor device having aluminum lines therein, wherein the occurrence of lateral extrusions and voids are reduced. The method comprises the formation of a metal stack on a surface of the substrate, wherein the aluminum layer of the metal stack is deposited under controlled conditions; etching the metal lines in the metal stack; and exposing the substrate to a subsequent anneal.

14 Claims, 5 Drawing Sheets

METHOD FOR CONTROLLING EXTRUSIONS IN ALUMINUM METAL LINES AND THE DEVICE FORMED THEREFROM

BACKGROUND OF THE INVENTION

1. Technical Field

The present invention relates generally to the field of semiconductor processing. More particularly, the present invention provides a method of producing aluminum lines on a substrate which prevents lateral extrusions between the lines, and the device so formed.

2. Related Art

When forming metal lines, a general three step process is often used. First, metal layers are formed on a substrate by sputtering a specific sequence of metals, including aluminum. Second, the desired metal lines are formed by photolithographically etching the metal layers. Third, the substrate is annealed to set the lines. Conventional sputtering techniques, however, tend to produce lateral extrusions during the photolithographic and annealing steps of the aluminum line formation process. These lateral extrusions may produce metal shorts between the aluminum lines. This becomes increasingly problematic as the devices become smaller, which forces the metal lines closer together. In addition, lateral extrusions pose reliability concerns-due to the metal "opens" or voids which may be produced within the metal lines due to volume changes.

Therefore, there exists a need in the industry for a method of forming aluminum metal lines on a substrate which prevents lateral extrusions between the aluminum metal lines.

SUMMARY OF THE INVENTION

The present invention provides a method of forming a semiconductor device that solves the above stated problems, and the device so formed.

The present invention provides a method for controlled deposition of aluminum onto a substrate, comprising the steps of: providing a substrate; heating the substrate to a temperature less than about 200° C.; providing a target from which aluminum is released; and sputtering aluminum onto the substrate, wherein the sputtering step includes controlling a power density to the target to be less than about 11 W/cm$^2$. This aspect allows for the reduced production of lateral extrusions during the formation of the aluminum lines of a semiconductor device. This aspect further provides for reduced occurrences of shorts within the device. This aspect also provides a clampless deposition procedure without the need for temperature control, and wherein the power density to the target is controlled to be less than 11 W/cm$^2$.

The second general aspect provides a method of forming aluminum lines, comprising the steps of: providing a substrate; heating the substrate to a temperature less than about 200° C.; and sputtering aluminum from a target onto the substrate, wherein the sputtering comprises control of a power density to the target to be less than about 11 W/cm$^2$. This aspect allows for advantages similar to those associated with the first aspect.

The third general aspect provides a method of reducing lateral extrusion in aluminum lines on a substrate, comprising the steps of: providing a substrate; heating the substrate to a temperature less than about 200° C.; and sputtering aluminum from a target onto the substrate, wherein the sputtering comprises control of a power density to the target to be less than about 11 W/cm$^2$. This aspect allows for advantages similar to those associated with the first aspect.

The fourth general aspect provides a semiconductor device having reduced lateral extrusions produced therein during the formation of aluminum lines. This aspect provides a semiconductor device produced using the method of, and possessing advantages similar to, the first aspect.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Figure 1:
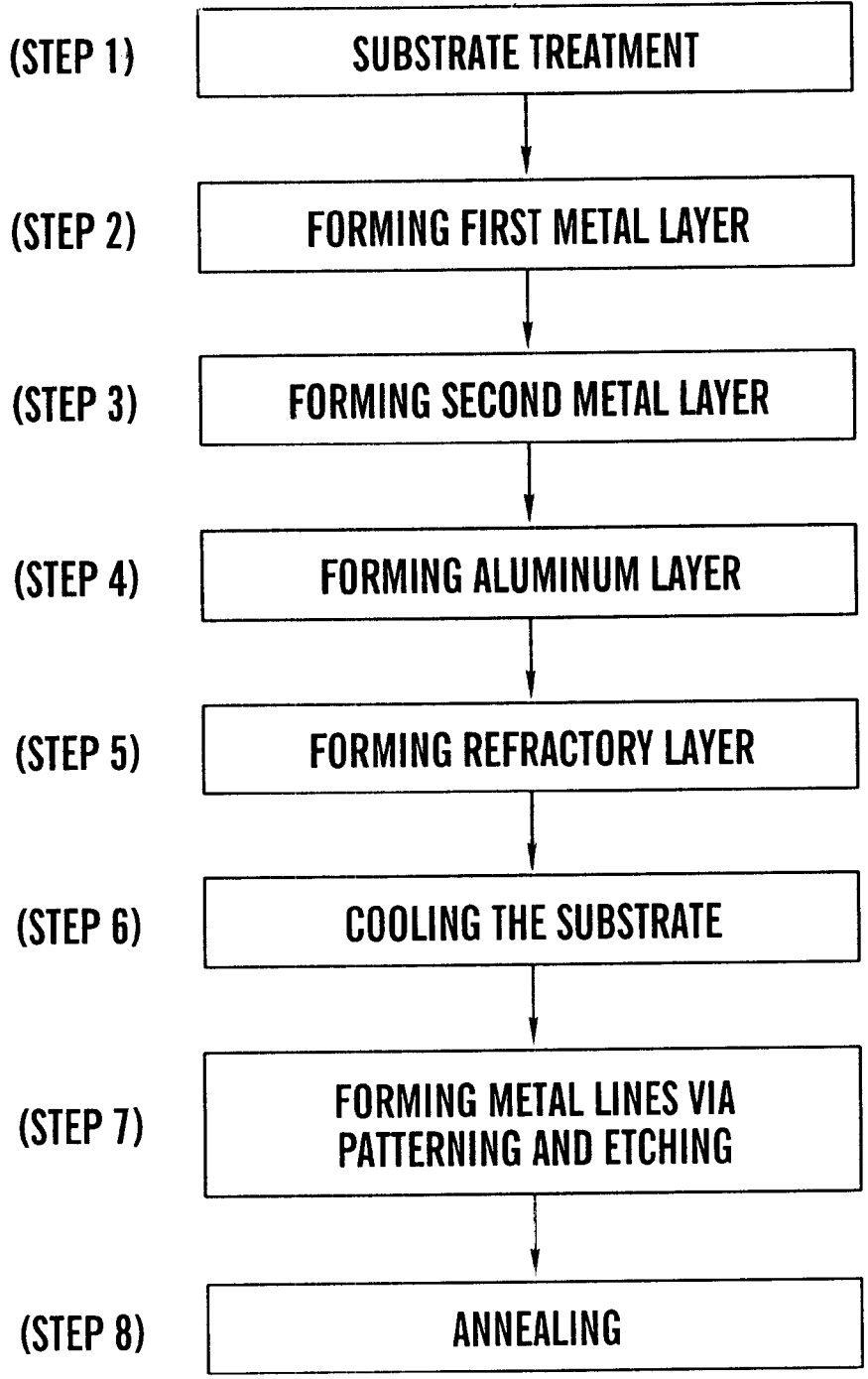
FIG. 1 depicts a flow chart which illustrates a method of forming a semiconductor device in accordance with a preferred embodiment of the present invention.
Figure 2:
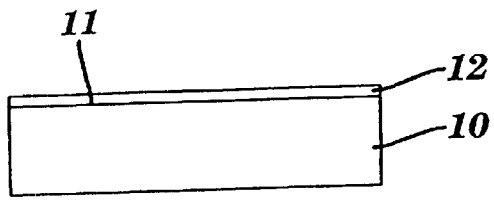
FIG. 2 depicts a cross-sectional view of a substrate having a dielectric layer thereon in accordance with a preferred embodiment of the present invention.

Referring to the drawings, FIG. 1 illustrates a flow chart generally describing the process used to manufacture a semiconductor device having metal lines, such that the formation of lateral extrusions and voids are reduced. In particular, FIG. 2 illustrates a substrate 10, preferably a silicon wafer, having an inter-layer-dielectric (ILD) 12 formed on a first surface 11 of the substrate 10 using conventional methods. The substrate 10 is then placed in a degas chamber 30, shown in FIG. 8. Within the degas chamber 30, the substrate 10 is exposed to temperatures less than approximately 200° C. for about 30 seconds, to prepare the substrate 10 for processing (step 1 of FIG. 1).

Figure 3:
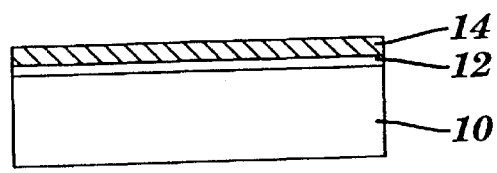
FIG. 3 depicts a cross-sectional view of the substrate having a first metal layer thereon in accordance with a preferred embodiment of the present invention.
Figure 8:
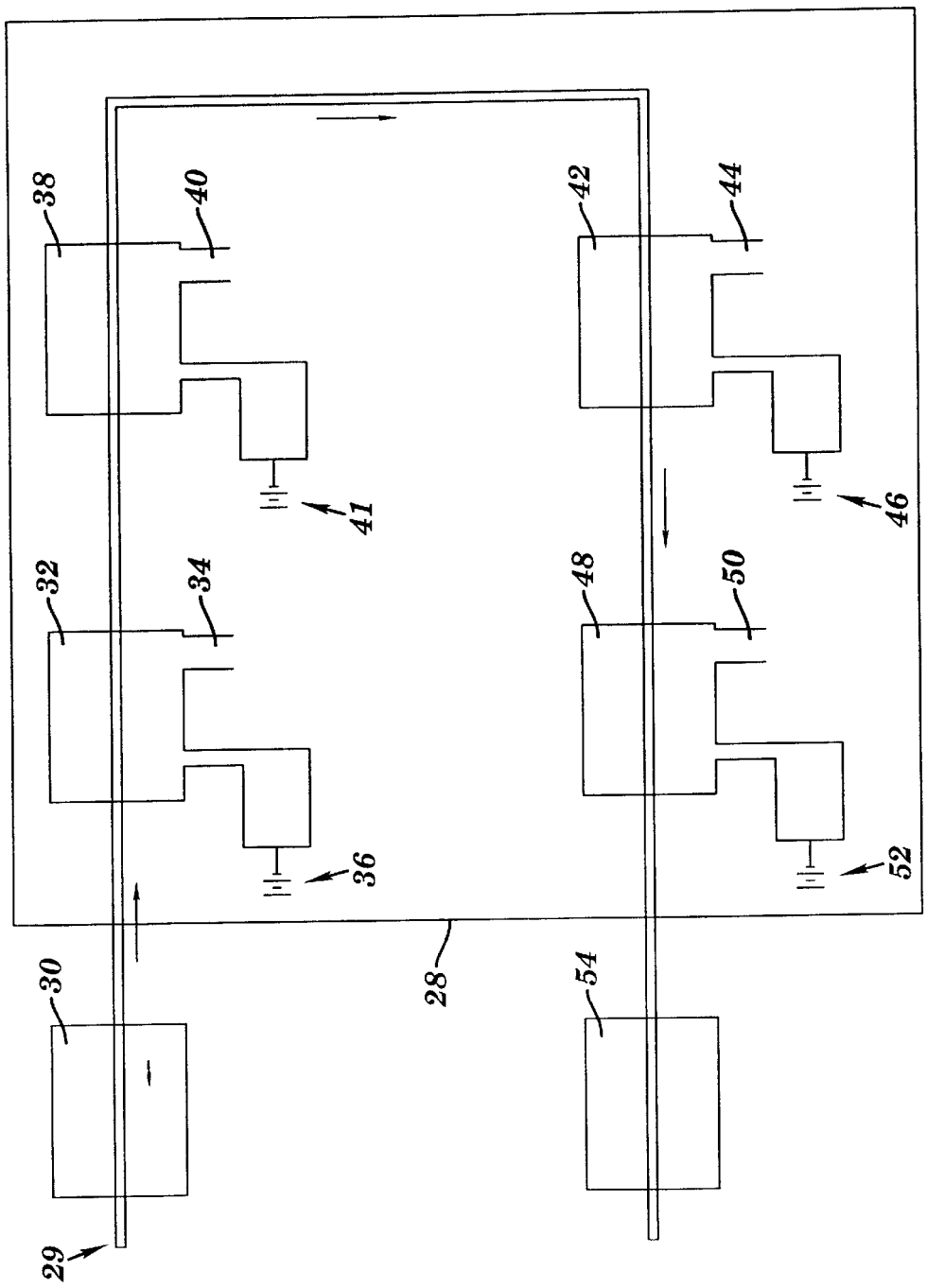
FIG. 8 depicts a sputtering tool having metal deposition chambers therein in accordance with a preferred embodiment of the present invention.

The substrate 10 then passes along path 29 to a first metal deposition chamber 32 within a sputtering tool 28 (refer to FIG. 8). The first metal deposition chamber 32 contains a high vacuum, approximately $10^{-9}$ torr, produced by a vacuum pump 34. The first metal deposition chamber 32 has an operating or deposition pressure of approximately 2–6 millitorr therein. A power density of approximately 1.21 W/cm$^2$ is applied via a power source 36 to the first metal deposition chamber 32 to sputter a first metal layer 14 on the substrate 10, as shown in FIG. 3 (step 2 of FIG. 1). The first metal layer 14 is preferably titanium (Ti), having a thickness of approximately 20–50 nm, however, other refractory metals may also be used, i.e., tungsten (W), etc.

Figure 4:
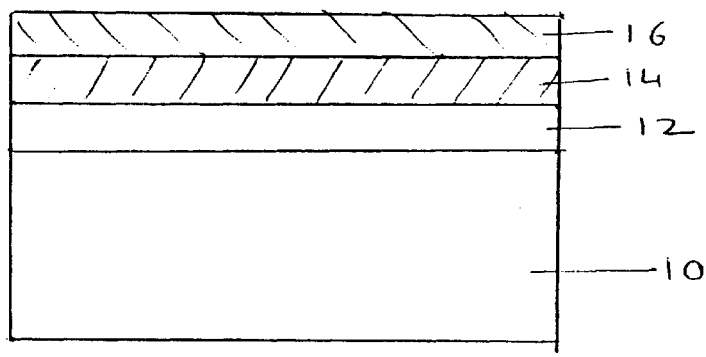
FIG. 4 depicts a cross-sectional view of the substrate having a second metal layer thereon in accordance with a preferred embodiment of the present invention.

The substrate 10 is then transferred along path 29 to a second metal deposition chamber 38 of the sputtering tool 28 (FIG. 8). A gas mixture of approximately 2:1 N$_2$:Ar is input into the second metal deposition chamber 38. The second metal deposition chamber 38 also contains a high vacuum, approximately $10^{-9}$ torr, provided by a vacuum pump 40. The second metal deposition chamber 38 has an operating pressure of approximately 2–6 millitorr therein. A power density of approximately 4.83 to 7.26 W/cm$^2$ is applied, via a power source 41, to the second metal deposition chamber 38 to sputter a second metal layer 16 onto the substrate 10, as shown in FIG. 4 (step 3 of FIG. 1). The second metal layer 16, preferably titanium nitride (TiN), has a thickness of approximately 20–50 nm.

Figure 5:
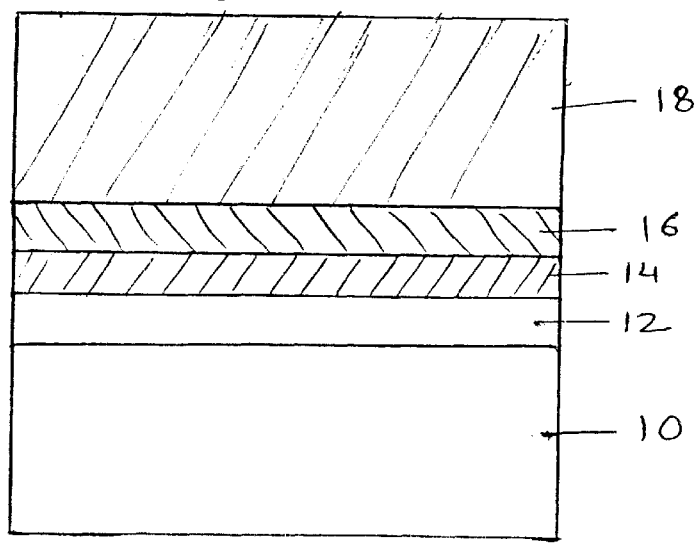
FIG. 5 depicts a cross-sectional view of the substrate having a third metal layer thereon in accordance with a preferred embodiment of the present invention.

The substrate 10 is then transferred along the path 29 to a third metal deposition chamber 42 of the sputtering tool 28 (FIG. 8). The third metal deposition chamber 42 contains argon (Ar) gas under approximately 2–6 millitorr of pressure. The third metal deposition chamber 42 contains a vacuum of approximately $10^{-9}$ torr, similar to that of the first and second metal deposition chambers 32, 38, which is provided by a vacuum pump 44. The third metal deposition chamber 42 has an operating or deposition pressure of approximately 2–6 millitorr therein. The power density applied to the substrate 10 within the third metal deposition chamber 42 is controlled to be less than about 11 W/cm$^2$. As a result, a third metal layer of aluminum 18 is formed, via sputtering, on the substrate 10, as shown in FIG. 5 (step 4 of FIG. 1). The third metal layer 18 has a thickness of approximately 200–700 nm.

Figure 6:
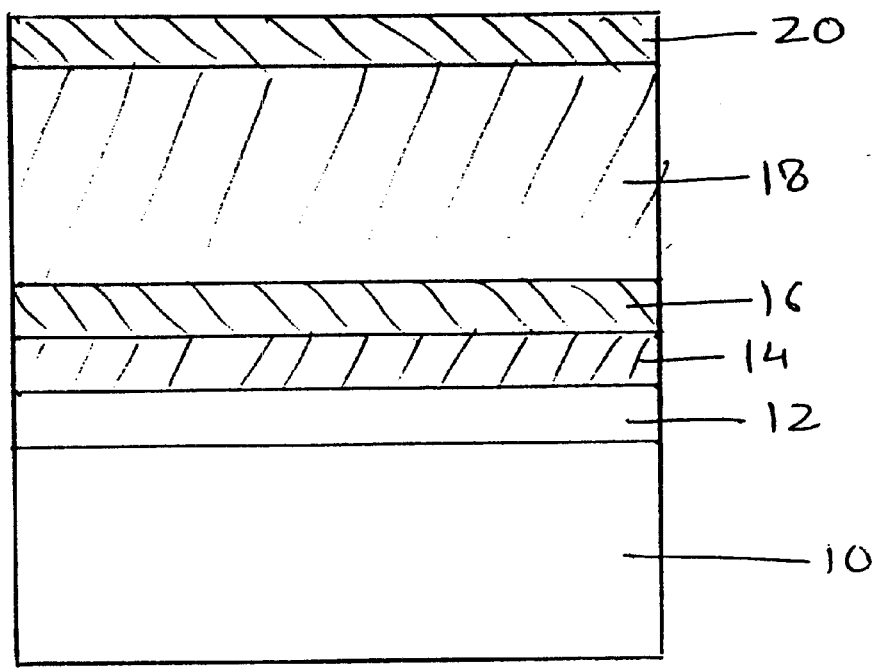
FIG. 6 depicts a cross-sectional view of the substrate having a refractory layer thereon in accordance with a preferred embodiment of the present invention.

The substrate 10 is then transferred along path 29 to a fourth metal deposition chamber 48 of the sputtering tool 28 (FIG. 8). A gas mixture of approximately 2:1 N$_2$:Ar is input into the fourth metal deposition chamber 48. The fourth metal deposition chamber 48 also contains a high vacuum, approximately $10^{-9}$ torr, provided by a vacuum pump 50. The fourth metal deposition chamber 48 has an operating pressure of approximately 2–6 millitorr therein. A power density of approximately 4.83 to 7.26 W/cm$^2$ is applied, via a power source 52, to the fourth metal deposition chamber 48 to sputter a refractory layer 20 onto the substrate 10, as shown in FIG. 6 (step 5 of FIG. 1). The refractory layer 20 is preferably TiN, having a thickness of approximately 20–50 nm.

After the metal stack 22 is formed, as illustrated in FIG. 6, the substrate 10 is removed from the sputtering tool 28, and 15 transferred along the path 29 to a cooling chamber 54 (FIG. 8), having a temperature between about 25–50° C. The substrate 10 is held in the cooling chamber 54 for approximately 30–60 seconds (step 6 of FIG. 1).

Figure 7:
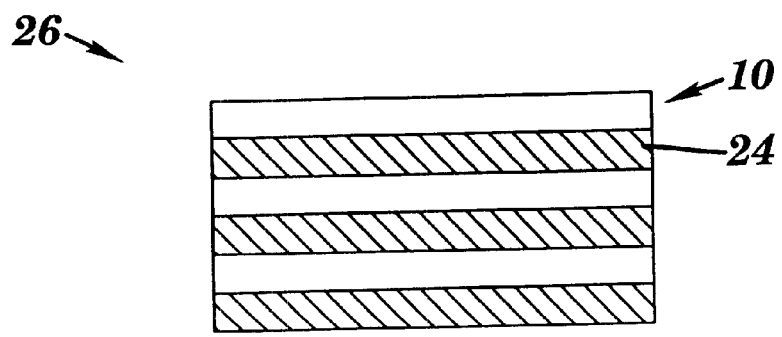
FIG. 7 depicts a top view of the device having metal lines thereon in accordance with a preferred embodiment of the present invention.

The metal stack 22 of the substrate 10 is patterned, then etched to form metal lines 24 (step 7 of FIG. 1). FIG. 7 shows a top view of a device 26 produced after the metal lines 24 are formed within the substrate 10. The device 26 is then annealed at a temperature less than approximately 400° C. for about 30 minutes to set the metal lines 24 (step 8 of FIG. 1). The device 26 formed using the above described method does not contain lateral extrusions or voids that often lead to shorts and other problems.

Figure 9:
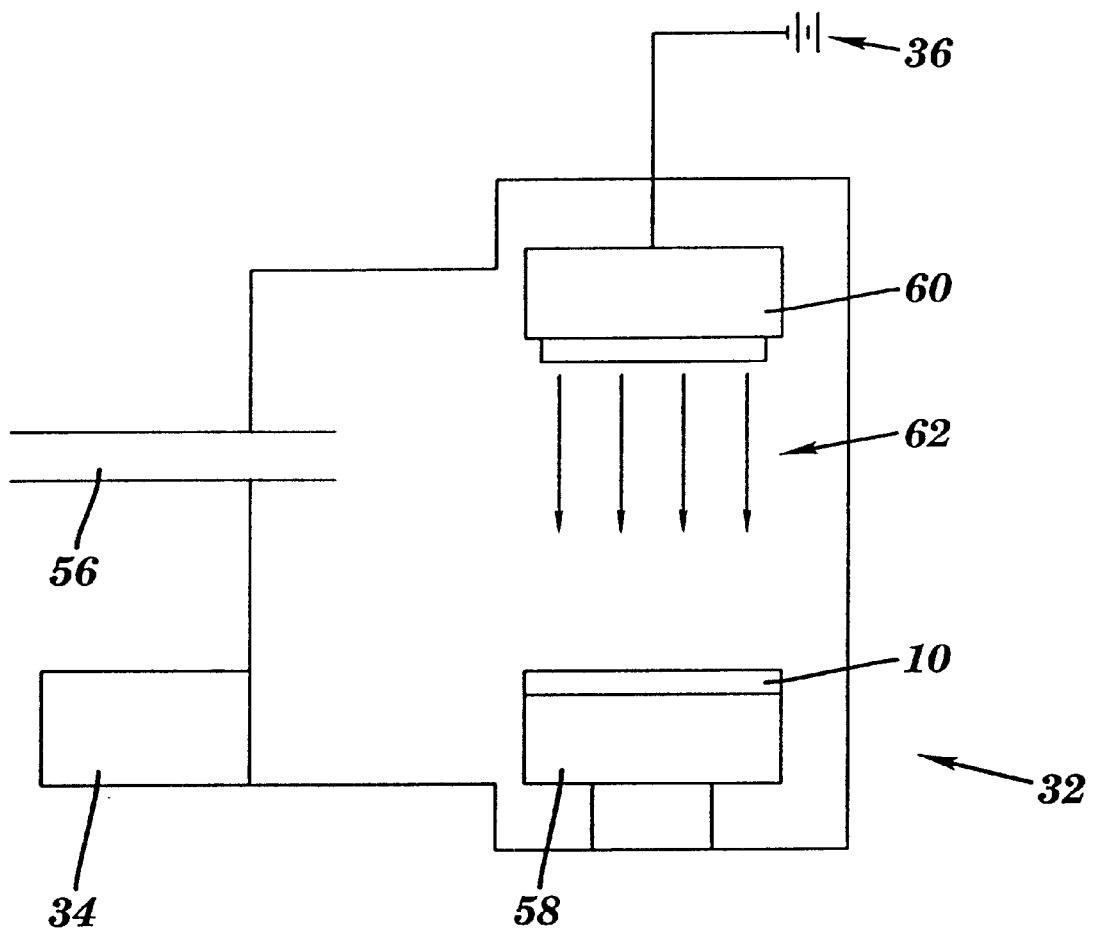
FIG. 9 depicts a metal deposition chamber in accordance with a preferred embodiment of the present invention.

FIG. 9 shows the first metal deposition chamber 32 of the sputtering tool 28 in greater detail. Each of the four metal deposition chambers 32, 38, 42, 48 function in a similar manner. As an example, the first metal deposition chamber 32 contains a connection to a vacuum pump 34, a gas valve 56, and a power source 36. In addition, each chamber 32, 38, 42, 48 contains a clampless pedestal or wafer holder 58, upon which the substrate 10 rests, and a target 60 from which the metal 62 is released toward the substrate 10 for the formation of the respective metal layers 14, 16, 18, 20.

It should be noted that the second metal layer 16 and refractory layer 20, are preferably TiN because this compound is extremely compatible with the aluminum used in the third metal layer 18 which forms the metal lines 24. For instance, the TiN used in the refractory layer 20 provides a redundant layer for electro migration of the aluminum in the third metal layer 18.

It should also be noted that the pedestal 58, within the metal deposition chambers 32, 38, 42 and 48, does not need to have active temperature control of the substrate 10. Rather, the process described in the present invention reduces the occurrence of lateral extrusions by controlling the power density to the target.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A method for controlled deposition of aluminum onto a substrate, comprising the steps of:

providing a substrate;

heating the substrate to a temperature less than about 200° C.;

transferring the substrate to a metal deposition chamber having a target from which aluminum is released; and sputtering aluminum onto the substrate, wherein the sputtering step includes controlling a power density to the target to be less than about 11 W/cm$^2$.

2. The method of claim 1, wherein the step of sputtering aluminum onto the substrate is followed by the steps of:

depositing a layer of metal;

cooling the substrate;

patterning and etching the layer of metal and the aluminum to form metal lines; and annealing the substrate.

3. The method of claim 2, wherein the layer of metal deposited on the substrate comprises a metal selected from the group consisting of: titanium, titanium nitride and tungsten.

4. The method of claim 2, wherein the step of cooling the substrate comprises the step of:

placing the substrate in a cooling chamber for approximately 30–60 seconds at approximately 25–50° C.

5. The method of claim 2, wherein the step of patterning and etching the layer of metal forms metal lines withon the substrate.

6. The method of claim 2, wherein the step of annealing the substrate is performed at less than approximately 400° C. for about 30 minutes.

7. The method of claim 1, wherein the step of providing the substrate further includes the steps of:
- providing a wafer;
- depositing a inter-layer-dielectric on a surface of the wafer;
- depositing a first layer of metal on the silicon wafer; and
- depositing a second layer of metal on the first layer of metal.

8. The method of claim 7, wherein the wafer comprises silicon.

9. The method of claim 1, wherein the step of heating the substrate is performed for approximately 30 seconds.

10. The method of claim 9, wherein the step of heating the substrate is performed in a degas chamber.

11. The method of claim 7, wherein the first layer of metal comprises a metal selected from the group consisting of: titanium and tungsten.

12. The method of claim 7, wherein the second layer of metal comprises a metal selected from the group consisting of: titanium nitride and tungsten.

13. A method of forming aluminum lines, comprising the steps of:
- providing a substrate;
- heating the substrate in a degas chamber to a temperature less than about 200° C.;
- transferring the substrate to a deposition chamber;
- sputtering aluminum from a target within the deposition chamber onto the substrate, wherein the sputtering comprises control of a power density to the target to be less than about 11 W/cm$^2$; and
- transferring the substrate to a cooling chamber.

14. A method of reducing lateral extrusions in aluminum lines on a substrate, comprising the steps of:
- providing a substrate;
- heating the substrate in a degas chamber to a temperature less than about 200° C.;
- transferring the substrate to a metal deposition chamber;
- sputtering aluminum from a target onto the substrate, wherein the sputtering comprises control of a power density to the target to be less than about 11 W/cm$^2$;
- transferring the substrate to a cooling chamber having a temperature between about 25–50° C.;
- forming aluminum metal lines on the substrate; and
- annealing the substrate.

\* \* \* \* \*